US012598898B2

(12) United States Patent
Go et al.

(10) Patent No.: US 12,598,898 B2
(45) Date of Patent: Apr. 7, 2026

(54) ELECTROLUMINESCENT DISPLAY DEVICE HAVING A STRUCTURE FOR IMPROVING LIGHT EXTRACTION EFFICIENCY

(71) Applicant: LG Display Co., Ltd., Seoul (KR)

(72) Inventors: Youngjune Go, Uijeongbu-si (KR); Joohwan Hwang, Paju-si (KR); Wooseok Noh, Seoul (KR); Hyejin Kim, Paju-si (KR); SungHo Lee, Daegu (KR); Huiseong Yu, Jeonju-si (KR); Seokmin Hong, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 537 days.

(21) Appl. No.: 17/962,260

(22) Filed: Oct. 7, 2022

(65) Prior Publication Data

US 2023/0200142 A1    Jun. 22, 2023

(30) Foreign Application Priority Data

Dec. 22, 2021    (KR) ......................... 10-2021-0185444

(51) Int. Cl.
*H10K 59/80*          (2023.01)
*H10K 59/122*          (2023.01)

(52) U.S. Cl.
CPC ......... *H10K 59/878* (2023.02); *H10K 59/122* (2023.02)

(58) Field of Classification Search
None
See application file for complete search history.

(56) References Cited

U.S. PATENT DOCUMENTS

| | | | |
|---|---|---|---|
| 2013/0001603 A1* | 1/2013 | Lim | H10K 59/80521 438/34 |
| 2015/0060820 A1* | 3/2015 | Takagi | H10K 59/80515 438/46 |
| 2018/0040854 A1* | 2/2018 | Sung | H10K 59/12 |
| 2019/0115404 A1* | 4/2019 | Moon | H10K 59/122 |
| 2019/0189728 A1* | 6/2019 | Lee | H10K 59/38 |
| 2020/0373366 A1* | 11/2020 | Sim | H10K 59/877 |
| 2024/0431147 A1* | 12/2024 | Kanehiro | H10K 59/122 |

FOREIGN PATENT DOCUMENTS

| | | |
|---|---|---|
| KR | 10-2023-0007421 A | 1/2013 |
| KR | 10-2014-0142627 A | 12/2014 |
| KR | 10-2016-0062307 A | 6/2016 |
| KR | 10-2019-0041558 A | 4/2019 |
| KR | 10-2020-0132520 A | 11/2020 |

* cited by examiner

*Primary Examiner* — Nduka E Ojeh
(74) *Attorney, Agent, or Firm* — Birch, Stewart, Kolasch & Birch, LLP

(57) ABSTRACT

An electroluminescent display device can include a substrate divided into a plurality of sub-pixels having an opening area and a non-opening area, a planarization layer disposed on the substrate, an anode disposed on the planarization layer, and a bank disposed on the anode and the planarization layer, the bank having an opening exposing a portion of the anode in the opening area. The electroluminescent display device has a light emitting unit disposed on the portion of the anode; a cathode disposed on the light emitting unit and the bank. A deposition blocking layer is disposed on the cathode in a portion of the non-opening area and the opening area, and a reflective layer disposed on the cathode in another portion of the non-opening area, in which the reflective layer does not overlap with the deposition blocking layer.

27 Claims, 9 Drawing Sheets

ELECTROLUMINESCENT DISPLAY DEVICE HAVING A STRUCTURE FOR IMPROVING LIGHT EXTRACTION EFFICIENCY

CROSS-REFERENCE TO RELATED APPLICATIONS

This application claims the benefit of and priority to Korean Patent Application No. 10-2021-0185444 filed on Dec. 22, 2021, in the Republic of Korea, the entire contents of which are hereby expressly incorporated by reference into the present application.

BACKGROUND

Technical Field

The present disclosure relates to an electroluminescent display device, and more particularly, to an electroluminescent display device allowing for an improvement in light extraction efficiency.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display device (LCD), an electro-wetting display device (EWD), an organic light emitting display device (OLED), and the like.

Among these display devices, an electroluminescent display device including an organic light emitting display device is a self-emission display device, and can be manufactured to be light and thin since it does not require a separate light source, unlike a liquid crystal display device having a separate light source.

In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

Meanwhile, light emitted from a light emitting layer of an electroluminescent display device can output to the outside of the electroluminescent display device through various components of the electroluminescent display device. However, a portion of the light emitted from the light emitting layer can be trapped inside the electroluminescent display device without emerging from the electroluminescent display device, whereby light extraction efficiency of the electroluminescent display device can be an issue.

For example, there can be a limitation in which a portion of the light emitted from the light emitting layer can be trapped inside the electroluminescent display device due to losses in total reflection, optical waveguide, and surface plasmon. Here, the loss in total reflection refers to a degradation in light extraction efficiency due to the light trapped inside the electroluminescent display device, of the light emitted from the light emitting layer, by total reflection at an interface between a substrate and the air. The loss in optical waveguide refers to a degradation in light extraction efficiency due to the light trapped inside by the total reflection at an interface of components inside the electroluminescent display device. The loss in surface plasmon refers to a situation when light vibrates free electrons of a metal surface due to a phenomenon in which the light is absorbed onto the metal surface during light incidence and propagation, whereby the reflection or transmission of the light can fail to thereby result in a degradation in light extracting efficiency.

SUMMARY OF THE DISCLOSURE

An aspect of the present disclosure is to provide an electroluminescent display device having improved light extraction efficiency and viewing angle.

Objects of the present disclosure are not limited to the above-mentioned objects, and other objects, which are not mentioned above, can be clearly understood by those skilled in the art from the following descriptions.

An electroluminescent display device according to an example embodiment of the present disclosure can include a substrate divided into a plurality of sub-pixels having an opening area and a non-opening area, a planarization layer disposed on the substrate, an anode disposed on the planarization layer, a bank disposed on the anode and the planarization layer and having an opening exposing a portion of the anode in the opening area, a light emitting unit disposed on the exposed anode, a cathode disposed on the light emitting unit and the bank, a deposition blocking layer disposed on the cathode in a portion of the non-opening area and the opening area and a reflective layer disposed on the cathode in another portion of the non-opening area.

Other detailed matters of the example embodiments are included in the detailed description and the drawings.

According to the present disclosure, by forming a metal patterning layer (MPL) in an emission area and forming a reflective layer having a side mirror structure on a bank of a non-emissive area, light extraction efficiency of an electroluminescent display device can be improved.

According to the present disclosure, light extraction efficiency of an electroluminescent display device can be further improved by additionally forming an anode having a side mirror structure on a side surface of a protrusion portion of a planarization layer protruding to a bank.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE EMBODIMENTS

Figure 1:
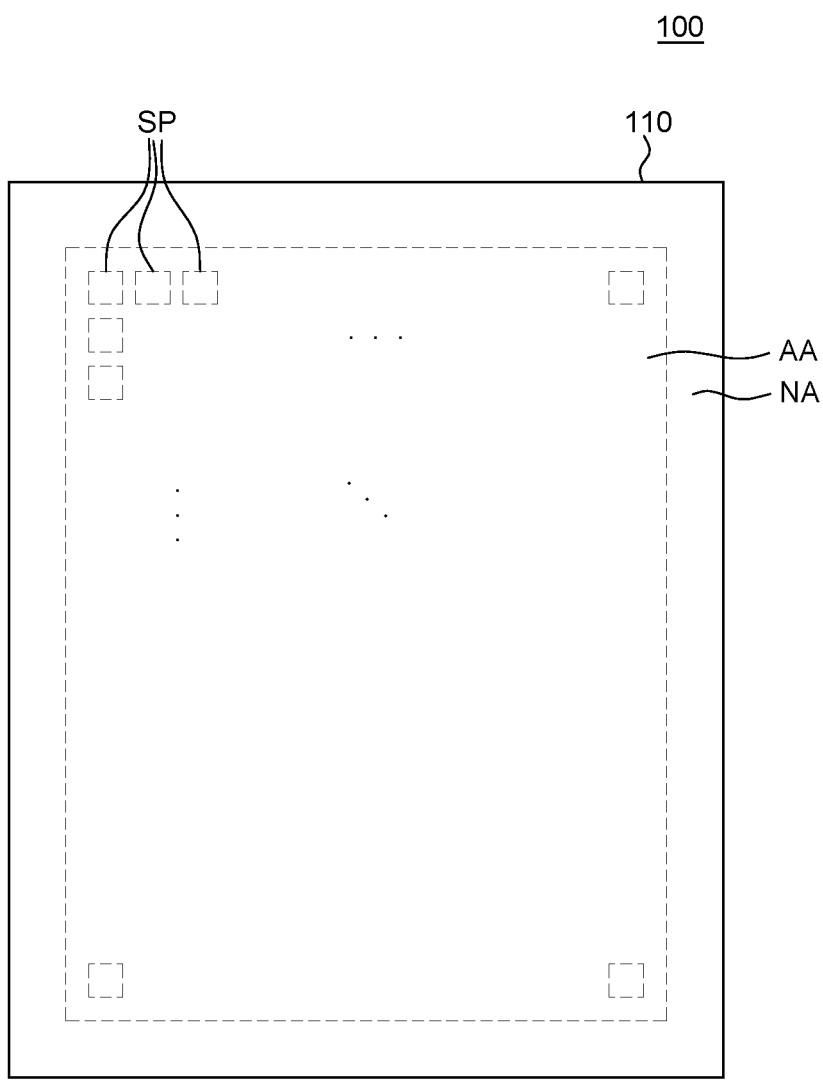
FIG. 1 is a plan view of an electroluminescent display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When the position relation between two parts is described using the terms such as "on," "above," "below," and "next," one or more parts can be positioned between the two parts unless the terms are used with the term "immediately" or "directly."

When an element or layer is disposed "on" another element or layer, another layer or another element can be interposed directly on the other element or therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various example embodiments of the present disclosure will be described in detail with reference to the accompanying drawings. All the components of each electroluminescent display device according to all embodiments of the present disclosure are operatively coupled and configured.

FIG. 1 is a plan view of an electroluminescent display device according to a first example embodiment of the present disclosure.

Figure 2:
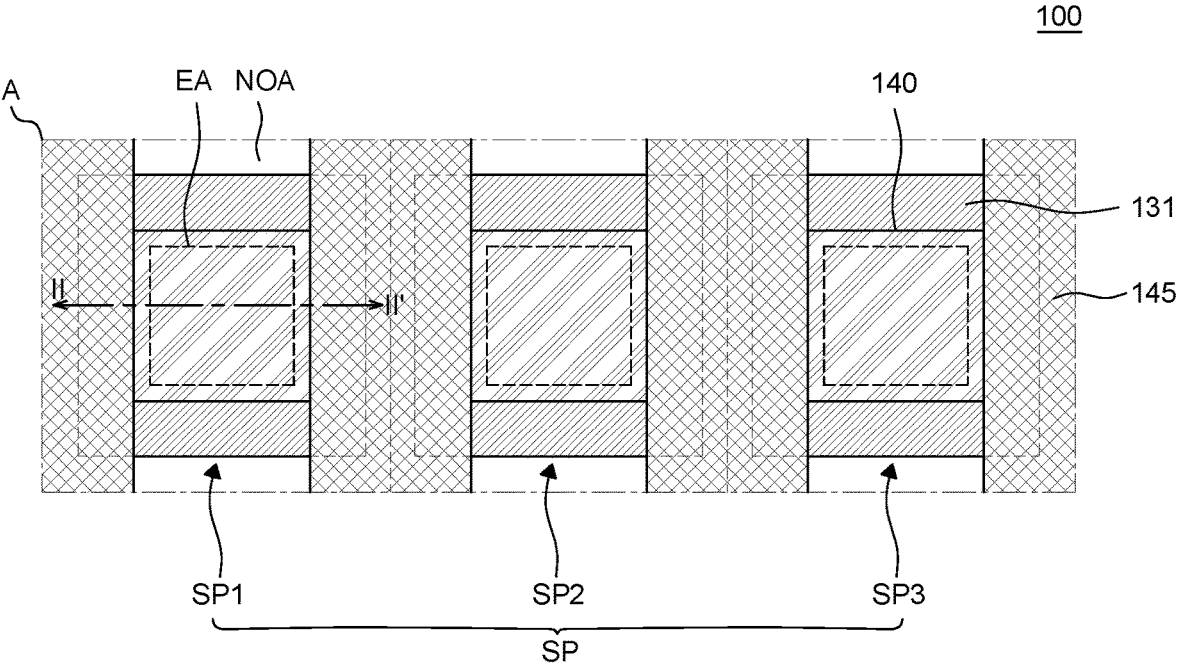
FIG. 2 is a plan view illustrating one pixel structure of the electroluminescent display device of FIG. 1 according to an embodiment of the present disclosure.

FIG. 2 is a plan view illustrating one pixel structure of the electroluminescent display device of FIG. 1.

Figure 3:
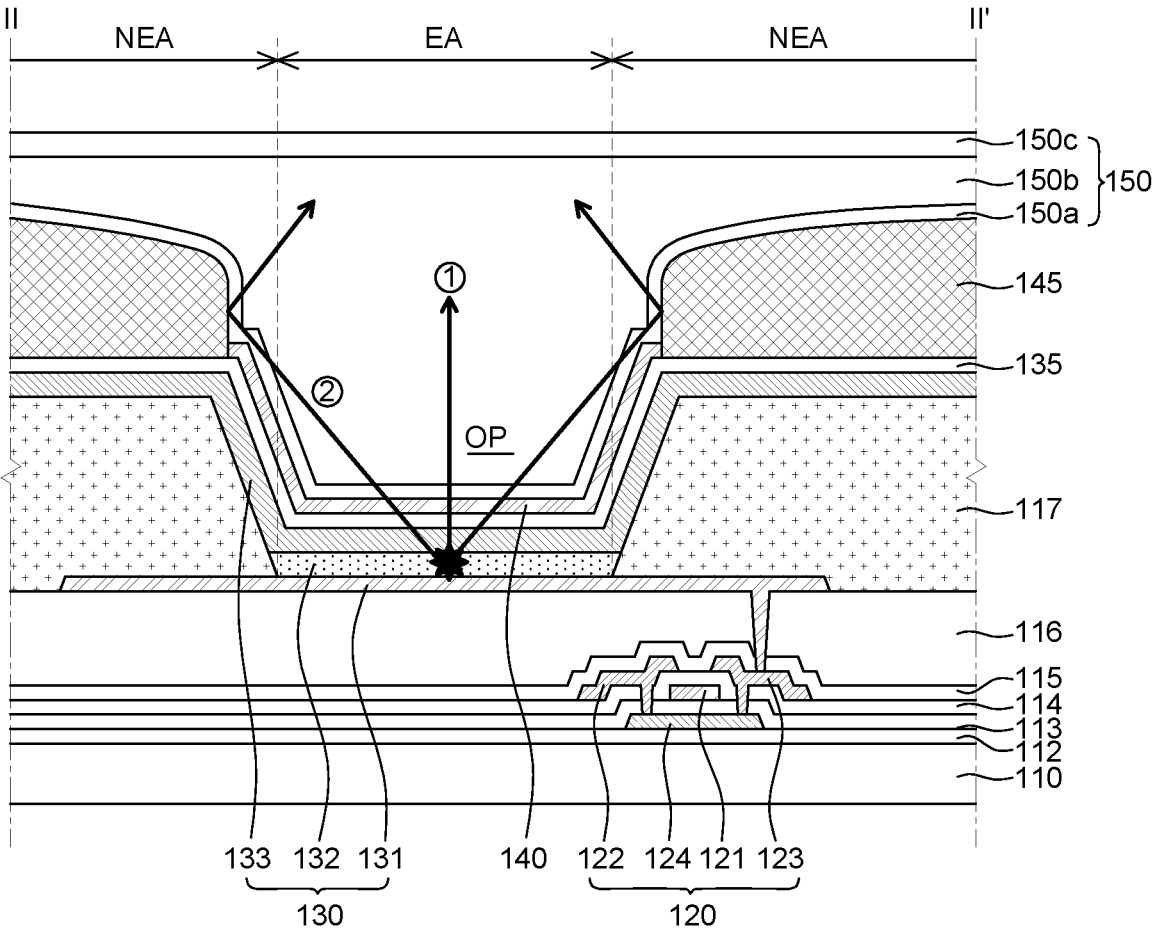
FIG. 3 is a cross-sectional view taken along line III-III' of FIG. 2 according to an embodiment of the present disclosure.

FIG. 3 is a cross-sectional view taken along line III-III' of FIG. 2.

In FIG. 2, only three sub-pixels SP are illustrated for convenience of explanation. Also, FIG. 3 is a cross-sectional view of an arbitrary first sub-pixel SP1 among the three sub-pixels SP. In addition, in FIG. 2, only an anode 131 is illustrated among components of a light emitting element 130 for convenience of explanation.

Referring to FIGS. 1 to 3, an electroluminescent display device 100 according to the first example embodiment of the present disclosure can be configured to include thin film transistors 120, light emitting elements 130, a planarization layer 116, banks 117, deposition blocking layers 140, reflective layers 145, and an encapsulation layer 150 that are disposed above a substrate 110.

The electroluminescent display device 100 can be implemented as a top emission type electroluminescent display device, but is not limited thereto.

The substrate 110 can include an active area AA and a non-active area NA. The active area AA is an area in which an image is displayed in the electroluminescent display device 100.

In the active area AA, display elements and various driving elements for driving the display element can be disposed. For example, the display element can be configured as the light emitting element 130 including the anode 131, a light emitting unit 132, and a cathode 133. In addition, various driving elements, such as the thin film transistor 120, a capacitor, and lines, for driving the display element can be disposed in the active area AA.

A plurality of sub-pixels SP can be divided in the active area AA.

The sub-pixel SP is a minimum unit constituting a screen, and each of the plurality of sub-pixels SP can include the light emitting element 130 and a driving circuit. In addition, each of the plurality of sub-pixels SP can emit light having a different wavelength. For example, the plurality of sub-pixels SP can include a first sub-pixel SP1 that is a red sub-pixel, a second sub-pixel SP2 that is a green sub-pixel, and a third sub-pixel SP3 that is a blue sub-pixel. However, the present disclosure is not limited thereto, and the plurality of sub-pixels SP can further include a white sub-pixel.

The driving circuit of the sub-pixel SP is a circuit for controlling driving of the light emitting element 130. For example, the driving circuit can be configured to include the thin film transistor 120 and the capacitor, but is not limited thereto.

The non-active area NA is an area in which an image is not displayed, and various components for driving the plurality of sub-pixels SP disposed in the active area AA can be disposed. For example, in the non-active area NA, a driver IC that supplies signals for driving the plurality of sub-pixels SP, a flexible film, or the like can be disposed.

The non-active area NA can be an area surrounding the active area AA as illustrated in FIG. 1, but is not limited thereto. For example, the non-active area NA can be an area extending from the active area AA.

The active area AA and the non-active area NA can have a shape suitable for designing an electronic apparatus on which the electroluminescent display device 100 is mounted. For example, an example shape of the active area AA can be a pentagonal shape, a hexagonal shape, a circular shape, or an oval shape or the like, in addition to a quadrangular shape.

The electroluminescent display device 100 can include various additional elements for generating various signals or driving the pixels in the active area AA. The additional elements for driving the pixels can include an inverter circuit, a multiplexer, an electro-static discharge (ESD) circuit, and the like. The electroluminescent display device 100 can include additional elements associated with functions other than driving the pixels. For example, the electroluminescent display device 100 can include additional elements that provide a touch sensing function, a user authentication function (e.g., fingerprint recognition), a multi-level pressure sensing function, a tactile feedback function, and the like. Such additional element can be positioned in the non-active area NA and/or in an external circuit connected to a connection interface.

More specifically, referring to FIGS. 2 and 3, the substrate 110 is a component for supporting and protecting various components of the electroluminescent display device 100.

The substrate 110 can be formed of glass or a plastic material having flexibility. When the substrate 110 is formed of a plastic material, it can be formed of, for example, polyimide (PI), but is not limited thereto.

A light blocking layer can be disposed on the substrate 110.

The light blocking layer can be formed of a metallic material having a light blocking function in order to block an introduction of external light into a semiconductor layer 124. For example, the light blocking layer can be formed in a single layer or multilayer structure formed of any one of opaque metals, such as aluminum (Al), chromium (Cr), tungsten (W), titanium (Ti), neodymium (Nd), nickel (Ni), molybdenum (Mo) and copper (Cu), or alloys thereof.

A buffer layer 112 can be disposed on the substrate 110 on which the light blocking layer is disposed.

The buffer layer 112 can be disposed on the substrate 110. The buffer layer 112 can improve adhesion between layers formed on the buffer layer 112 and the substrate 110, and block alkali components and the like, leaking from the substrate 110.

The buffer layer 112 can be formed of a single layer of silicon nitride (SiNx) or silicon oxide (SiOx) or multiple layers of silicon nitride (SiNx) and/or silicon oxide (SiOx), but is not limited thereto. In this situation, the buffer layer 112 can be omitted based on a type and material of the substrate 110, a structure and type of the thin film transistor 120, and the like.

The buffer layer 112 can include a contact hole exposing a portion of the light blocking layer.

The thin film transistor 120 can be disposed on the buffer layer 112.

The illustrated thin film transistor 120 can be a driving transistor, and illustration of the switching transistor is omitted in FIG. 3 for convenience. Other sensing transistors and compensation circuits or the like can also be included in the electroluminescent display device 100.

The driving transistor 120 can transmit a current that is received through a power line to the anode 131 according to a signal received from the switching transistor, and can control light emission by the current transmitted to the anode 131. To this end, the driving transistor 120 can include a gate electrode 121, a source electrode 122, a drain electrode 123, and the semiconductor layer 124.

The switching transistor is turned on by a gate pulse that is supplied to a gate line and can transmit a data voltage that is supplied to a data line to the gate electrode 121 of the driving transistor 120.

The semiconductor layer 124 can be disposed on the buffer layer 112.

The semiconductor layer 124 can be formed of an oxide semiconductor, amorphous silicon, polycrystalline silicon, or an organic semiconductor.

The oxide semiconductor has excellent mobility and uniformity properties. The oxide semiconductor can be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, a tin gallium zinc oxide (SnGaZnO)-based material, an aluminum gallium zinc oxide (AlGaZnO)-based material, and a tin aluminum zinc oxide (SnAlZnO)-based material, a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium oxide (InO)-based material, a tin oxide (SnO)-based material, an indium gallium oxide (InGaO)-based material, an indium magnesium oxide (InMgO)-based material, and a zinc oxide (ZnO)-based material, or the like.

The semiconductor layer 124 can include a source region and a drain region including p-type or n-type impurities, and can further include a low concentration-doped region between the source region and the drain region adjacent to the channel region, but the present disclosure is not limited thereto.

The source region and the drain region are regions doped with a high concentration of impurities, and can be connected to the source electrode 122 and the drain electrode 123 of the thin film transistor 120, respectively.

As an impurity ion, the p-type impurity or n-type impurity can be used. The p-type impurity can be one of boron (B), aluminum (Al), gallium (Ga), and indium (In), and the n-type impurity can be one of phosphorus (P), arsenic (As), and antimony (Sb).

The channel region can be doped with the n-type impurity or p-type impurity according to a structure of the thin film transistor 120 of the NMOS or PMOS.

A first insulating layer 113 can be disposed on the semiconductor layer 124.

The first insulating layer 113 is disposed between the gate electrode 121 and the semiconductor layer 124 so that a current flowing through the semiconductor layer 124 does not flow to the gate electrode 121, and the first insulating layer 113 can be composed of a single layer of silicon oxide (SiOx) or silicon nitride (SiNx), or multiple layers of silicon nitride (SiNx) and/or silicon oxide (SiOx), but is not limited thereto. Silicon oxide is less ductile than metal, but is superior in ductility to silicon nitride and can be formed as a single layer or multiple layers according to characteristics thereof.

The gate electrode 121 can be disposed on the first insulating layer 113.

In this situation, the gate electrode can be composed of a single layer or multiple layers of a conductive metal such as copper (Cu), aluminum (Al), chromium (Cr), molybdenum (Mo), gold (Au), titanium (Ti), nickel (Ni), neodymium (Nd) or the like or alloys thereof, but is not limited thereto.

A second insulating layer 114 can be disposed on the gate electrode 121 as an interlayer insulating layer. The second insulating layer 114 can be formed of a single layer of silicon nitride (SiNx) or silicon oxide (SiOx) or multiple layers of silicon nitride (SiNx) and/or silicon oxide (SiOx), but is not limited thereto.

The source electrode 122 and the drain electrode 123 can be disposed on the second insulating layer 114. For example, the source electrode 122 and the drain electrode 123 can be composed of a single layer or multiple layers of a conductive metal such as aluminum (Al), molybdenum (Mo), chromium (Cr), gold (Au), titanium (Ti), nickel (Ni), neodymium (Nd), copper (Cu), or the like or alloys thereof, but the present disclosure is not limited thereto.

One side of the drain electrode 123 can be electrically connected to the semiconductor layer 124 and the other side of the drain electrode 123 can be electrically connected to the light blocking layer.

A passivation layer 115 can be disposed on the thin film transistor 120.

The passivation layer 115 can be formed of a single layer of silicon nitride (SiNx) or silicon oxide (SiOx) or multiple layers of silicon nitride (SiNx) and/or silicon oxide (SiOx), but is not limited thereto.

The passivation layer 115 serves to prevent unnecessary electrical connection between components disposed thereon and therebelow and to prevent contamination or damage from the outside, and can be omitted according to a type and material of the substrate 110, a structure and type of the thin film transistor 120 or the like.

The thin film transistors 120 can be classified into a coplanar structure and an inverted staggered structure according to positions of components constituting the thin film transistor 120.

For example, in the thin film transistor having the inverted staggered structure, the gate electrode can be positioned on an opposite side of the source electrode and the drain electrode with respect to the semiconductor layer. On the other hand, as illustrated in FIG. 3, in the thin film transistor 120 having a coplanar structure, the gate electrode 121 can be positioned on the same side as the source electrode 122 and the drain electrode 123 with respect to the semiconductor layer 124.

Although the thin film transistor 120 having the coplanar structure is illustrated in FIG. 3, the present disclosure is not limited thereto, and the electroluminescent display device according to the first example embodiment of the present disclosure can include a thin film transistor having the inverted staggered structure. In addition, some of the thin film transistors 120 can have the coplanar structure, and some of the thin film transistors 120 can have the inverted staggered structure.

The planarization layer 116 can be disposed on the passivation layer 115. The planarization layer 116 is an insulating layer for protecting the thin film transistor 120 and alleviating a step between the layers disposed on the substrate 110.

The planarization layer 116 can be formed of any one of an acrylic resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and a photoresist, but is not limited thereto.

The light emitting element 130 including the anode 131, the light emitting unit 132, and the cathode 133 can be disposed on the planarization layer 116.

The anode 131 can be disposed on the planarization layer 116.

The anode 131 is an electrode serving to supply holes to the light emitting unit 132, and can be connected to the thin film transistor 120 through a contact hole in the planarization layer 116.

In the situation of a bottom emission type in which light is emitted to a lower portion where the anode 131 is disposed, the anode 131 can be formed of indium tin oxide (ITO), indium zinc oxide (IZO), or the like, which is a transparent conductive material, but the present disclosure is not limited thereto.

On the other hand, in the situation of a top emission type in which light is emitted to an upper portion where the cathode 133 is disposed as in the first example embodiment of the present disclosure, the anode 131 can further include a reflective layer such that the emitted light is reflected from the anode 131 and is more smoothly emitted in a direction toward the upper portion where the cathode 133 is disposed.

For example, the anode 131 can be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer can be formed of silver (Ag) or an alloy including silver, or other metals.

The anode 131 of the first example embodiment of the present disclosure can have a substantially flat surface, but is not limited thereto.

The bank 117 can be disposed on the anode 131 and the planarization layer 116.

The bank 117 disposed on the anode 131 and the planarization layer 116 can define the sub-pixels SP by partitioning an area that actually emits light, for example, an emission area EA.

After a photoresist is formed on the anode 131, the bank 117 can be formed through a photolithography process. The photoresist refers to a photosensitive resin of which solubility in a developer is changed by an action of light, and a specific pattern can be obtained by exposing and developing the photoresist. The photoresist can be classified into a positive type photoresist and a negative type photoresist. In this situation, the positive photoresist refers to a photoresist of which solubility in a developer for an exposed portion is increased by exposure, and when the positive photoresist is developed, a pattern in which the exposed portion is removed is obtained. The negative photoresist refers to a photoresist of which solubility in a developer for an exposed portion is lowered by exposure, and when the negative photoresist is developed, a pattern in which an unexposed portion is removed is obtained.

A fine metal mask (FMM), which is a deposition mask, can be used to form the light emitting unit 132 of the light emitting element 130.

In addition, in order to prevent damage that can be caused by contact with the deposition mask disposed on the bank 117 and to maintain a constant distance between the bank 117 and the deposition mask, a spacer formed of one of benzocyclobutene, photoacrylic, and polyimide, which is a transparent organic material, can be disposed on the bank 117.

The bank 117 in the emission area EA can be removed to thereby form an opening OP exposing a portion of the anode 131.

A side surface of the bank 117 in the emission area EA that is exposed by the opening OP can have an inclination.

The light emitting unit 132 can be disposed between the anode 131 and the cathode 133.

The light emitting unit 132 which serves to emit light, can include at least one layer of a hole injection layer (HIL), a hole transport layer (HTL), a light emitting layer, an electron transport layer (ETL), and an electron injection layer (EIL), and some of the components can be omitted according to a structure or characteristics of the electroluminescent display device 100. Here, as the light emitting layer, an electroluminescent layer and an inorganic light emitting layer can also be applied.

The hole injection layer is disposed on the anode 131 and serves to facilitate hole injection.

The hole transport layer is disposed on the hole injection layer and serves to facilitate hole transfer to the light emitting layer The light emitting layer is disposed on the hole transport layer, and can include a material capable of emitting light of a specific color to thereby emit light of a specific color. In addition, a light emitting material can be formed using a phosphorescent material or a fluorescent material.

The electron injection layer can be further disposed on the electron transport layer. The electron injection layer is an organic layer that facilitates injection of electrons from the cathode 133, and can be omitted according to the structure and characteristics of the electroluminescent display device 100.

Meanwhile, by further disposing an electron blocking layer or a hole blocking layer for blocking a flow of holes or electrons at a position adjacent to the light emitting layer, it is possible to prevent a phenomenon in which the electrons move from the light emitting layer when injected into the light emitting layer and pass through the hole transport layer adjacent thereto or a phenomenon in which the holes move from the light emitting layer when injected into the light emitting layer and pass through the electron transport layer adjacent thereto, so that luminous efficiency can be improved.

The light emitting unit 132 in the opening OP can be disposed to be inclined along an inclined side surface of the bank 117.

The cathode 133 is disposed on the light emitting unit 132 and serves to supply electrons to the light emitting unit 132. In the bottom emission type, since the cathode 133 needs to supply electrons, it can be formed of a metallic material, such as magnesium, silver-magnesium or the like, which is a conductive material having a low work function, but is not limited thereto.

In the situation of the top emission type as in the first example embodiment of the present disclosure, the cathode 133 can be formed of a transparent conductive oxide, such as indium tin oxide (ITO), indium zinc oxide (IZO), indium tin zinc oxide (ITZO), zinc oxide (ZnO), and tin oxide (TO).

The cathode 133 in the opening OP can be inclined along the inclined side surface of the bank 117.

A capping layer 135 can be disposed on the cathode 133.

The capping layer 135 can serve to help light emitted from the light emitting unit 132 to be efficiently emitted to the outside while protecting the light emitting element 130.

For example, the capping layer 135 can be formed of an inorganic material or an organic material, and can be formed of various organic compounds having a refractive index of 1.7 or higher, in order to prevent loss of light that is emitted to the outside due to total reflection. In addition, the capping layer 135 can be formed of, for example, an inorganic compound containing fluorine (F) such as lithium fluoride (LiF), or an organic material such as a carbon compound.

The capping layer 135 in the opening OP can be disposed to be inclined along the inclined side surface of the bank 117.

Meanwhile, it is characterized in that the deposition blocking layer 140 according to the first example embodiment of the present disclosure is disposed on the capping layer 135 in the emission area EA, and the reflective layer 145 is disposed on the capping layer 135 in a non-emission area NEA except for the deposition blocking layer 140.

Referring to FIGS. 2 and 3, the deposition blocking layer 140 is illustrated as having a greater width and a wider area than those of the emission area EA, but is not limited thereto. And, the deposition blocking layer 140 can be disposed to have substantially the same width and area as those of the emission area EA.

The reflective layer 145 can have a side mirror structure with respect to the opening OP.

A width of the reflective layer 145 that is deposited by a metal patterning layer (MPL) can vary depending on a size of the sub-pixel SP, but can have a value of 5 µm to 22 µm (e.g., 13 µm), and the reflective layer 145 can have a height of 0.5 µm to 2 µm (e.g., 1.25 µm) to form a taper, but the present disclosure is not limited thereto.

The deposition blocking layer 140 can be formed of a metal patterning layer (MPL).

For example, the deposition blocking layer 140 can be formed of a carbon organic material, such as 3-(biphenyl-4-yl)-5-(4-tert-butylphenyl)-4-phenyl-4H-1,2,4-triazole (TAZ), but the present disclosure is not limited thereto.

For example, when the deposition blocking layer 140 is formed by depositing the MPL of an organic material on the capping layer 135 in the emission area EA with the use of a fine metal mask (FMM) and then, full deposition of a metal is performed, the metal is not deposited on the deposition blocking layer 140 and thus, the reflective layer 145 can be selectively formed only on the capping layer 135 in the non-emission area NEA except for the deposition blocking layer 140 (e.g., the deposition blocking layer 140 can have properties that repel deposited metal or avoid metal from being deposited, such as providing low adhesion or a metallophic surface). However, the present disclosure is not limited thereto, and a slit-shaped mask or a checkerboard-shaped mask covering the emission area EA can be used to form the reflective layer 145.

In FIG. 2, an example in which an open mask having a slit shape, that covers the emission area EA is used to form the reflective layer 145 is illustrated, but the present disclosure is not limited thereto. When an open mask having a slit shape is used, the reflective layer 145 can have a slit shape in a vertical direction, but is not limited thereto.

As the MPL has low adhesion properties in which surface energy of a material itself is low or interfacial energy between the metal and MPL is high, a probability of metal desorption from an MPL surface during metal deposition significantly increases, and metal nucleation does not occur. Accordingly, it is possible to form a self-aligned patterned metal by selectively depositing the metal only in a high-adhesion region having a relatively low interfacial energy.

For example, the MPL serves to prevent the reflective layer 145 from being formed in the emission area EA, and thus, can be referred to as the deposition blocking layer 140 (e.g., the deposited metal will only stick or adhere to areas around the deposition blocking layer 140, but not on the deposition blocking layer 140 itself).

The reflective layer 145 of the present disclosure can be disposed to be in contact with a side surface of the deposition blocking layer 140, but is not limited thereto.

The reflective layer 145 of the present disclosure is characterized in that it is disposed on the capping layer 135 in the non-emission area NEA. For example, when a reflective structure is formed in the emission area, a distance between the bank and the anode is not constant in each sub-pixel, so that light efficiency can be different in each sub-pixel. However, in the present disclosure, as the reflective layer 145 is disposed in the non-emission area NEA, the defect described above does not occur.

In addition, the reflective layer 145 of the present disclosure is advantageous in forming a high taper.

The reflective layer 145 can be formed of a metal having a reflective characteristic, for example, silver (Ag) or aluminum (Al) having a reflective characteristic while having a surface energy of 1.0 $J/m^2$ to 1.5 $J/m^2$, for example. In particular, in the situation of silver, it is advantageous for forming a high taper due to an aggregation property thereof.

The reflective layer 145 can be formed to have a high taper, for example, can have a shape in which an upper portion has a width smaller than that of a lower portion to allow for reflection, such as a conical shape or a hemispherical shape.

For example, a side mirror structure using an existing anode (ITO/Ag/ITO) is generally formed through a photo process, but it is not easy to form a high taper of 60° or more due to limitations of photo processes such as exposure, etching and the like. In addition, a reflective structure of a high taper using a bump requires high-temperature deposition of a metal with a high melting point, and an FMM needs to be used to accurately form a bump structure at a corresponding location. There are disadvantages such as clogging and the like due to metal aggregation between mask sheets.

On the other hand, since the reflective layer 145 of the present disclosure can be deposited without an open mask or a mask having a slit or checkerboard shape, the above-described defect can be resolved. For example, according to an embodiment of the present invention, a metal deposition layer can be evenly applied across the entire surface, but only stick to the portions around the deposition blocker layer 140 corresponding to the non-emission area NEA (e.g., similar to a sheet of metal with holes punched in it over each light emitting device).

In addition, according to the first example embodiment of the present disclosure, as the reflective layer 145 having a high taper reflective characteristic is disposed in the non-emission area NEA, light trapped or lost therein can be utilized or redirected, so that light extraction efficiency and a viewing angle can be improved.

For example, when only an anode is disposed on a planarization layer having a flat shape as in a previous electroluminescent display device, laterally directed light, for example, light emitted at a low emission angle does not travel in an upper direction and may not be extracted to the outside of an electroluminescent display device due to a loss in total reflection or a loss in optical waveguide. However, in the electroluminescent display device 100 according to the first example embodiment of the present disclosure, second light ② that is emitted at a lower emission angle from the light emitting unit 132 (e.g., light emitted towards the sides of opening OP), together with first light ① that is emitted from the light emitting unit 132 in the upper direction, is reflected from the reflective layer 145 disposed above the bank 117, and can be extracted in the upper direction, for example, to the emission area EA. In this way, more light can be funneled out of the device.

Accordingly, in the electroluminescent display device 100 according to the first example embodiment of the present disclosure, the reflective layer 145 disposed above the bank 117 functions as a side mirror, so that light which can be lost in the electroluminescent display device 100 can be extracted into the emission area EA, thereby enhancing light extraction efficiency and power consumption.

The reflective layer 145 can be disposed in the non-emission area NEA, while an edge of the reflective layer 145 can be disposed at a boundary between the emission area EA and the non-emission area NEA, but is not limited thereto. For example, when the deposition blocking layer 140 is formed to extend to a portion of the non-emission area NEA, the reflective layer 145 can be disposed such that the edge thereof is positioned in the non-emission area NEA that is spaced apart from the emission area EA by a predetermined distance.

The encapsulation layer 150 can be disposed on the deposition blocking layer 140 and the reflective layer 145. In the encapsulation layer 150, a primary protective layer 150a, an organic layer 150b, and a secondary protective layer 150c can be sequentially formed to constitute an encapsulation means. However, the number of inorganic layers and organic layers constituting the encapsulation layer 150 is not limited thereto.

In the situation of the primary protective layer 150a, since it is formed of an inorganic insulating layer, stack coverage is not good due to a lower step. However, since the organic layer 150b thereon serves to perform planarization, the secondary protective layer 150c is not affected by a step due to the layer therebelow. In addition, since a thickness of the organic layer 150b formed of a polymer is sufficiently thick, cracks caused by foreign materials can be compensated.

On a front surface of the substrate 110 including the secondary protective layer 150c, a multilayered protective film can be positioned to face it for encapsulation, and an adhesive which is transparent and has adhesive properties can be interposed between the encapsulation layer 150 and the protective film.

A polarizing plate for preventing reflection of light incident from the outside can be attached onto the protective film, but is not limited thereto.

Meanwhile, in the present disclosure, a mirror-shaped anode can be added to a side surface of the light emitting unit, which will be described in detail through a following second example embodiment. For example, the anode can provide an inclined side mirror function to funnel or reflect even more light out of the device.

Figure 4:
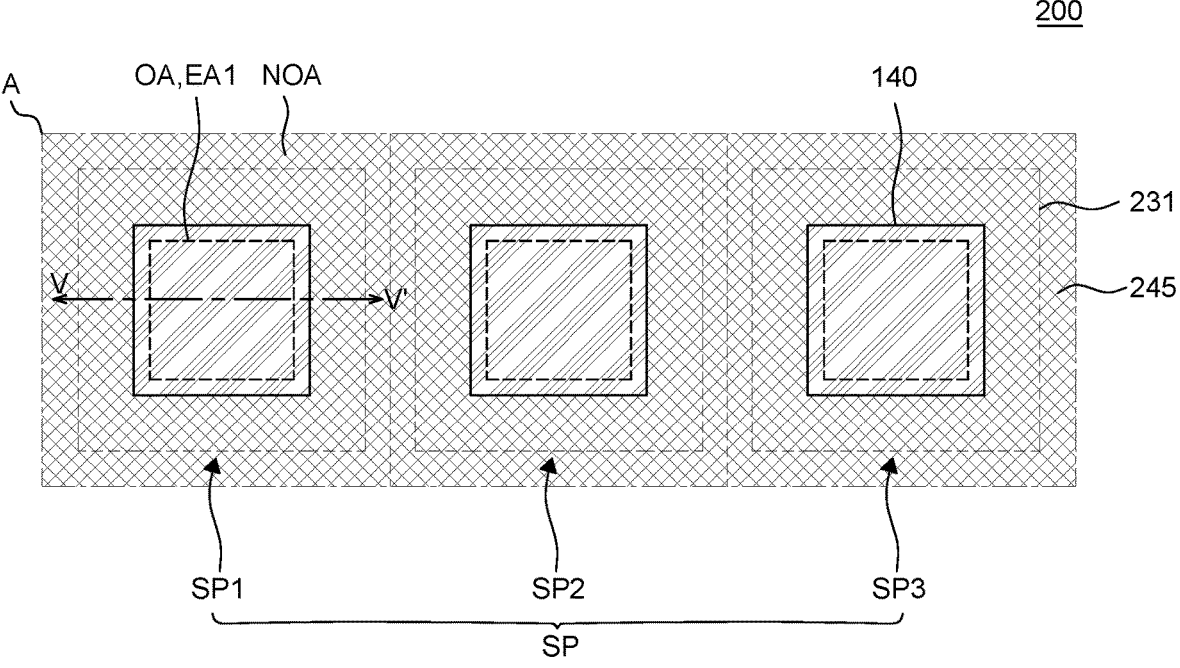
FIG. 4 is a plan view illustrating a pixel structure according to another embodiment of the present disclosure.

FIG. 4 is a plan view illustrating a pixel structure according to a second example embodiment of the present disclosure.

Figure 5:
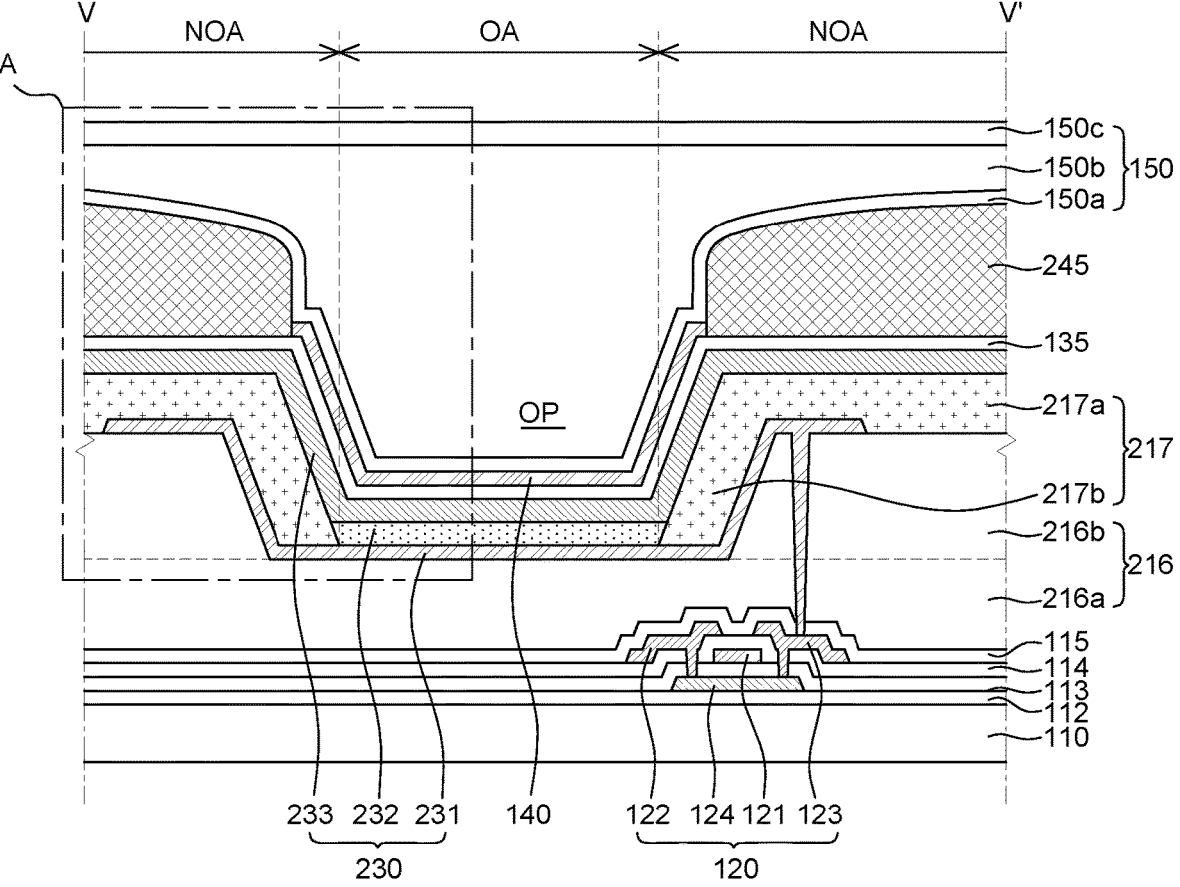
FIG. 5 is a cross-sectional view taken along line V-V' of FIG. 4 according to an embodiment of the present disclosure.

FIG. 5 is a cross-sectional view taken along line V-V' of FIG. 4.

Figure 6:
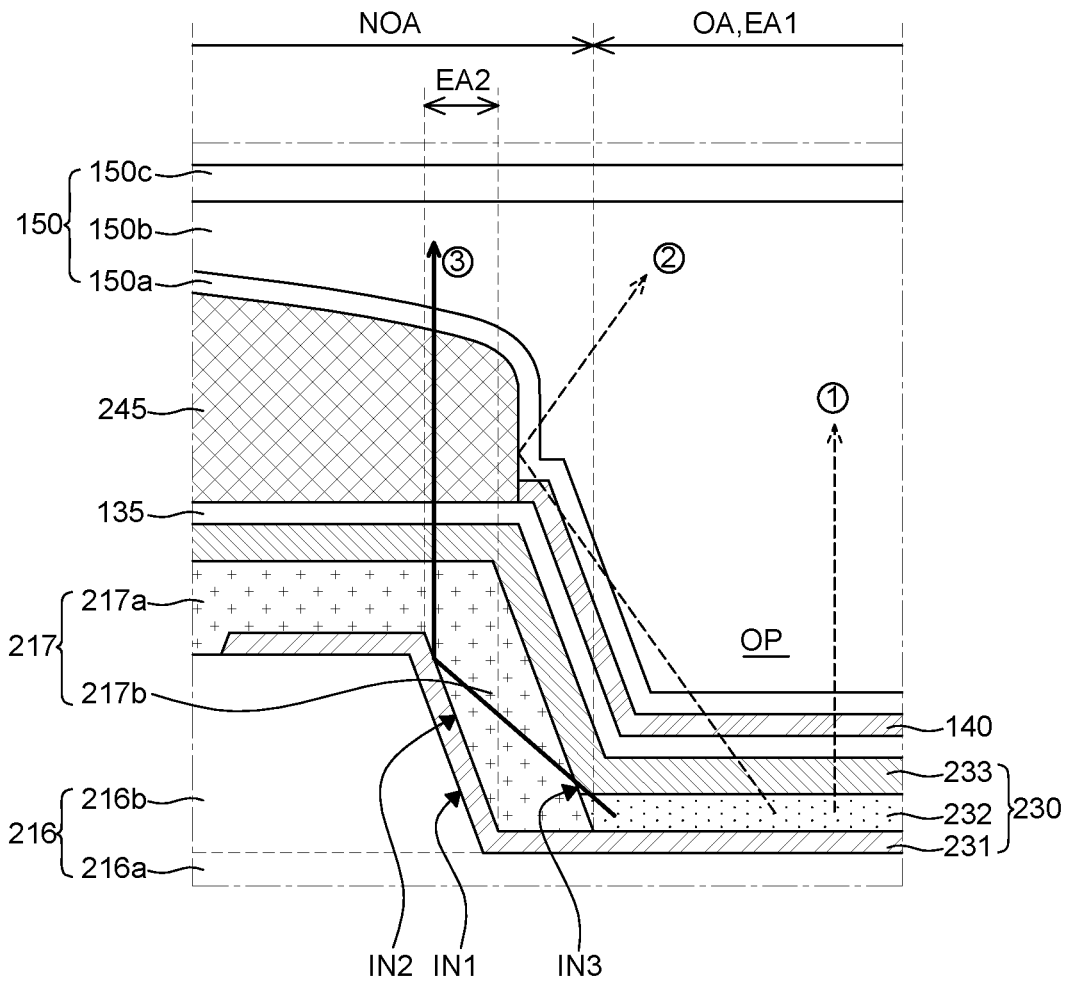
FIG. 6 is an enlarged view of part A of FIG. 5 according to an embodiment of the present disclosure.

FIG. 6 is an enlarged view of part A of FIG. 5.

The second example embodiment of FIGS. 4 to 6 differs from the first example embodiment of FIGS. 1 to 3 only in terms of configurations of a planarization layer 216, an anode 231, and a bank 217 and other configurations thereof are substantially the same, and thus, a duplicate description will be omitted or may be briefly discussed. The same reference numerals are used for the same components.

In FIG. 4, only three sub-pixels SP are illustrated for convenience of explanation. Also, FIG. 5 is a cross-sectional view of an arbitrary first sub-pixel SP1 among the three sub-pixels SP. In addition, in FIG. 4, only the anode 231 is illustrated among components of a light emitting element 230 for convenience of explanation.

Referring to FIGS. 4 to 6, an electroluminescent display device 200 according to the second example embodiment of the present disclosure can be configured to include the thin film transistor 120, the light emitting element 230, the planarization layer 216, the bank 217, the deposition blocking layer 140, a reflective layer 245, and the encapsulation layer 150 that are above substrate 110.

The electroluminescent display device 200 can be implemented as a top emission type electroluminescent display device, but is not limited thereto.

The planarization layer 216 can be disposed on the thin film transistor 120.

The planarization layer 216 can be disposed on the passivation layer 115. The planarization layer 216 is an insulating layer for protecting the thin film transistor 120 and planarizing an upper portion of the thin film transistor 120. In this situation, a contact hole for exposing the drain electrode 123 of the thin film transistor 120 can be formed in the planarization layer 216. In FIG. 5, a contact hole for exposing the drain electrode 123 is formed in the planarization layer 216, but the present disclosure is not limited thereto. For example, a contact hole for exposing the source electrode 122 can be formed in the planarization layer 216.

The planarization layer 216 can be formed of any one of an acrylic resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and a photoresist, but is not limited thereto.

The planarization layer 216 can include a base portion 216a and a protrusion portion 216b. The base portion 216a and the protrusion portion 216b can be integrally formed as shown in FIGS. 5 and 6. For example, the base portion 216a and the protrusion portion 216b can be formed of the same material and formed simultaneously through the same process, for example, a mask process, but embodiments are not limited thereto.

The base portion 216a is disposed on the thin film transistor 120.

An upper surface of the base portion 216a has a surface parallel to the substrate 110. Accordingly, the base portion 216a can planarize a step that can be caused by components disposed thereunder.

The protrusion portion 216b can be disposed on the base portion 216a. The protrusion portion 216b is integrally formed with the base portion 216a and is formed to protrude from the base portion 216a. Thus, an upper surface of the protrusion portion 216b can be narrower than a lower surface thereof. However, the present disclosure is not limited thereto.

The protrusion portion 216b can include the upper surface and a side surface. The upper surface of the protrusion portion 216b can be a surface positioned at an uppermost portion of the protrusion portion 216b and can be a surface substantially parallel to the base portion 216a or the substrate 110. The side surface of the protrusion portion 216b can be a surface connecting the upper surface of the protrusion portion 216b and the base portion 216a. Accordingly, the side surface of the protrusion portion 216b can have a shape inclined toward the base portion 216a from the upper surface. The inclined side surface of the protrusion portion 216b can be referred to as a first inclined surface IN1.

FIG. 5 illustrates that the planarization layer 216 includes the base portion 216a having a planar upper surface and the protrusion portion 216b protruding from the base portion 216a, but the present disclosure is not limited thereto. For example, together, the protrusion portion 216b and the base portion 216a can form a type of crater or divot around each subpixel, forming a concave portion that can better funnel and reflect light out of the device. As long as the planarization layer 216 has a shape in which the base portion 216a and the protrusion portion 216b are embodied, a detailed configuration of the planarization layer 216 is not limited thereto, and can be variously implemented.

The light emitting element 230 can be disposed on the planarization layer 216. The light emitting element 230 can include the anode 231 connected to the drain electrode 123 of the thin film transistor 120, a light emitting unit 232 disposed on the anode 231, and a cathode 233 disposed on the light emitting unit 232.

The anode 231 can be disposed on the planarization layer 216 to cover the upper surface of the base portion 216a and at least a side surface of the protrusion portion 216b. For example, the anode 231 can be disposed on the upper surface of the base portion 216a on which the protrusion portion 216b is not disposed, the side surface of the protrusion portion 216b, and a portion of an upper surface of the protrusion portion 216b. And, the anode 231 can be disposed along shapes of the base portion 216a and the protrusion portion 216b, but the present disclosure is not limited thereto. The anode 231 can be disposed only on the upper surface of the base portion 216a on which the protrusion portion 216b is not disposed and the side surface of the protrusion portion 216b.

With reference to FIG. 6, when the protrusion portion 216b has an inclined side surface, for example, the first inclined surface IN1, the anode 231 can have an inclined side surface corresponding to the first inclined surface IN1 of the protrusion portion 216b, for example, a second inclined surface IN2.

The anode 231 is an electrode serving to supply holes to the light emitting unit 232, and can be connected to the thin film transistor 120 through a contact hole in the planarization layer 216.

In the situation of a bottom emission type in which light is emitted to a lower portion where the anode 231 is disposed, the anode 231 can be formed of indium tin oxide (ITO), indium zinc oxide (IZO), or the like, which is a transparent conductive material, but the present disclosure is not limited thereto.

On the other hand, in the situation of a top emission type in which light is emitted to an upper portion where the cathode 233 is disposed as in the second example embodiment of the present disclosure, it can further include a reflective layer such that the emitted light is reflected from the anode 231 and is more smoothly emitted in a direction toward the upper portion where the cathode 233 is disposed.

For example, the anode 231 can be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer can be formed of silver (Ag) or an alloy including silver or other metals.

The reflective layer can be disposed on the planarization layer 216 to reflect light emitted from the light emitting element 230 upwardly. For example, light generated by the light emitting unit 232 of the light emitting element 230 may not be only emitted upwardly, but can also be emitted laterally. The light emitted laterally can be directed to the inside of the electroluminescent display device 200, can be trapped inside the electroluminescent display device 200 by total reflection, and can be extinguished while traveling in an inward direction of the electroluminescent display device 200. Accordingly, the reflective layer is disposed under the light emitting unit 232 and is disposed to cover the side surface of the protrusion portion 216*b* of the planarization layer 216, whereby a traveling direction of third light ③ traveling toward a side portion of the light emitting unit 232 can be changed to an upper direction.

Accordingly, in the second example embodiment of the present disclosure, a second emission area EA2 can be additionally formed in a non-opening area NOA in addition to a first emission area EA1. The second emission area EA2 refers to an emission area that is formed by light traveling from the side portion of the light emitting unit 232 to an upper surface thereof by the second inclined surface IN2 of the anode 231.

The reflective layer can be formed of a metallic material, for example, can be formed of a metallic material, such as aluminum (Al), silver (Ag), copper (Cu), a magnesium-silver alloy, but is not limited thereto.

In addition, a transparent conductive layer can be disposed on and/or below the reflective layer. The transparent conductive layer can be formed of a conductive material having a high work function in order to supply holes to the light emitting unit 232. For example, the transparent conductive layer can be formed of a transparent conductive oxide such as indium tin oxide (ITO), indium zinc oxide (IZO), indium tin zinc oxide (ITZO), zinc oxide (ZnO), and tin oxide (TO), but is not limited thereto.

The bank 217 can be disposed on the anode 231 and the planarization layer 216.

The bank 217 disposed on the anode 231 and the planarization layer 216 can define sub-pixels by partitioning an area that actually emits light, for example, a first emission area EA1. For example, since the bank 217 is not disposed in the first emission area EA1, the light emitting unit 232 can be disposed directly on the anode 231 and generate light from the light emitting unit 232. On the other hand, as the bank 217 is disposed between the anode 231 and the light emitting unit 232 in the non-emission area, generation of light can be blocked. However, in the second example embodiment of the present disclosure, as the second emission area EA2 is disposed in the non-opening area NOA, the non-emission area of the second example embodiment can be different from that of the first example embodiment, but the present disclosure is not limited thereto.

For example, the bank 217 in the first emission area EA1 is removed to thereby form an opening OP exposing a portion of the anode 231. An area in which the opening OP is formed can be defined as an opening area OA and the other area can be defined as the non-opening area NOA. In this situation, the opening area OA and the first emission area EA1 can refer to substantially the same area, but the present disclosure is not limited thereto.

In addition, the second emission area EA2 formed by the second inclined surface IN2 of the anode 231 can be disposed in the non-opening area NOA, and in this situation, the non-opening area NOA excluding the first emission area EA1 and the second emission area EA2 can be defined as the non-emission area.

The bank 217 can be formed of an organic material. For example, the bank 217 can be formed of an organic material such as polyimide, acrylic, or benzocyclobutene resin, but is not limited thereto. When the bank 217 is formed of an organic material, it can have a refractive index of about 1.6. FIGS. 5 and 6 show that the bank 217 is formed of an organic material, the bank 217 is not necessarily formed of an organic material and can be formed of an inorganic material.

The bank 217 can include a first portion 217*a* disposed on the protrusion portion 216*b* of the planarization layer 216 and a second portion 217*b* facing the base portion 216*a* from the first portion 217*a*. At this time, when the protrusion portion 216*b* has an inclined side surface, for example, the first inclined surface IN1, the second portion 217*b* of the bank 217 can have an inclined side surface corresponding to the first inclined surface IN1 of the protrusion portion 216*b* and the second inclined surface IN2 of the anode 231, for example, a third inclined surface IN3.

In this situation, the first portion 217*a* can be disposed to cover the protrusion portion 216*b* and the anode 231 on the protrusion portion 216*b*. The first portion 217*a* can planarize an upper portion of the protrusion portion 216*b* of the planarization layer 216. Accordingly, the first portion 217*a* can have a flat upper surface. For example, the upper surface of the first portion 217*a* can be parallel to the upper surface of the protrusion portion 216*b*.

In addition, the second portion 217*b* can be disposed toward the base portion 216*a* from the first portion 217*a*. The second portion 217*b* surrounds the first portion 217*a* and can have the third inclined surface IN3 that is inclined along a step between the upper surface of the base portion 216*a* and the upper surface of the protrusion portion 216*b*. The second portion 217*b* exposes a portion of the anode 231 and can define the first emission area EA1, for example, the opening area OA. Also, the first inclined surface IN1, the second inclined surface IN2 and the third inclined surface IN3 can all be inclined at a same angle. Alternatively, the first inclined surface IN1, the second inclined surface IN2 and the third inclined surface IN3 can be inclined at different angles.

Referring to FIGS. 5 and 6, the bank 217 is illustrated as including the first portion 217*a* and the second portion 217*b*. However, as long as the bank 217 has a shape including the first portion 217*a* and the second portion 217*b*, a detailed configuration of the bank 217 according to the second example embodiment of the present disclosure is not limited to the first portion 217*a* and the second portion 217*b*, and can be variously implemented.

In addition, although it is illustrated that the first portion 217*a* and the second portion 217*b* are integrally formed in FIGS. 5 and 6, the present disclosure is not limited thereto, and the first portion 217*a* and the second portion 217*b* can be formed separately from each other and can be made of different materials or the same material.

The light emitting unit 232 can be disposed on the anode 231.

Referring to FIGS. 5 and 6, the light emitting unit 232 is illustrated as being disposed only on the anode 231 in the first emission area EA1, but the present disclosure is not limited thereto, and the light emitting unit 232 can also be disposed on the bank 217 in the non-emission area NEA. In this situation, the light emitting unit 232 can be disposed along the shapes of the anode 231 and the bank 217. Also, the light emitting unit 232 in the opening OP can be inclined along the third inclined surface IN3 of the inclined bank 217.

The light emitting unit 232 which serves to emit light, can include at least one layer of a hole injection layer (HIL), a hole transport layer (HTL), a light emitting layer, an electron transport layer (ETL), and an electron injection layer (EIL), and some of the components can be omitted according to a structure or characteristics of the electroluminescent display device 200. Here, as the light emitting layer, an electroluminescent layer and an inorganic light emitting layer can also be applied.

The hole injection layer is disposed on the anode 231 and serves to facilitate hole injection.

The hole transport layer is disposed on the hole injection layer and serves to facilitate hole transfer to the light emitting layer.

The light emitting layer is disposed on the hole transport layer, and can include a material capable of emitting light of a specific color to thereby emit light of a specific color. In addition, a light emitting material can be formed using a phosphorescent material or a fluorescent material.

The electron injection layer can be further disposed on the electron transport layer. The electron injection layer is an organic layer that facilitates injection of electrons from the cathode 233, and can be omitted according to the structure and characteristics of the electroluminescent display device 200.

Meanwhile, by further disposing an electron blocking layer or a hole blocking layer for blocking a flow of holes or electrons at a position adjacent to the light emitting layer, it is possible to prevent a phenomenon in which the electrons move from the light emitting layer when injected into the light emitting layer and pass through the hole transport layer adjacent thereto or a phenomenon in which the holes move from the light emitting layer when injected into the light emitting layer and pass through the electron transport layer adjacent thereto, so that luminous efficiency can be improved.

The cathode 233 is disposed on the light emitting unit 232 and serves to supply electrons to the light emitting unit 232. In the bottom emission type, since the cathode 233 needs to supply electrons, it can be formed of a metallic material such as magnesium, silver-magnesium or the like, which is a conductive material having a low work function, but is not limited thereto.

In the situation of the top emission type as in the second example embodiment of the present disclosure, the cathode 233 can be formed of a transparent conductive oxide, such as indium tin oxide (ITO), indium zinc oxide (IZO), indium tin zinc oxide (ITZO), zinc oxide (ZnO), and tin oxide (TO). When the cathode 233 is formed of a transparent conductive oxide such as ITO, a refractive index of the cathode 233 can be about 1.8 to 1.9. In addition, the cathode 233 can be formed of a metallic material such as silver (Ag), copper (Cu), a magnesium-silver alloy, or the like or a very thin metallic material, but is not limited thereto. When the cathode 233 is formed of a metallic material, it has a very low refractive index. For example, when silver (Ag) is used as the cathode 233, the refractive index of the cathode 233 can be about 0.13. However, since the electroluminescent display device 200 is a top emission type electroluminescent display device, since the cathode 233 has a very thin thickness, the refractive index of the cathode 233 may not affect traveling of light.

At an edge of the opening OP, the cathode 233 can be inclined along the third inclined surface IN3 of the bank 217.

The capping layer 135 can be disposed on the cathode 233.

For example, the capping layer 135 can be formed of an inorganic material or an organic material, and can be formed of various organic compounds having a refractive index of 1.7 or higher, in order to prevent loss of light that is emitted to the outside due to total reflection. In addition, the capping layer 135 can be formed of, for example, an inorganic compound containing fluorine (F) such as lithium fluoride (LiF), or an organic material such as a carbon compound.

At the edge of the opening OP, the capping layer 135 can be inclined along the third inclined surface IN3 of the bank 217.

Meanwhile, it is characterized in that the deposition blocking layer 140 according to the second example embodiment is disposed on the capping layer 135 in the opening area OA, and the reflective layer 245 is disposed on the capping layer 135 in the non-opening area NOA except for an area where the deposition blocking layer 140 is formed.

In FIGS. 4 to 6, the deposition blocking layer 140 is illustrated as having a greater width and a wider area than those of the opening area OA, but the present disclosure is not limited thereto. The deposition blocking layer 140 can be disposed to have substantially the same width and area as those of the opening OP.

As described above, the reflective layer 245 can have a side mirror structure with respect to the opening OP.

The deposition blocking layer 140 can be formed of a metal patterning layer (MPL).

In FIG. 4, an example in which an open mask having a checkerboard shape, that covers the opening area OA is used to form the reflective layer 245 is illustrated, but the present disclosure is not limited thereto. When an open mask having a checkerboard shape is used, the reflective layer 245 can have a checkerboard shape except for the opening area OA, but is not limited thereto (e.g., the opening area OA can have a circular shape, rectangular shape, triangular shape, hexagonal shape, oval shape, etc.).

The reflective layer 245 of the present disclosure is characterized in that it is disposed on the capping layer 135 in the non-opening area NOA.

The reflective layer 245 can be formed of a metal having a reflective characteristic, for example, silver (Ag) or aluminum (Al) having a reflective characteristic while having a surface energy of 1.0 $J/m^2$ to 1.5 $J/m^2$, for example. Meanwhile, in the situation of the second example embodiment of the present disclosure, the reflective layer 245 can be configured as a translucent layer so that second light ②, which will be described later, can be extracted in an upper direction.

The reflective layer 245 can be formed to have a high taper, for example, can have a shape in which an upper portion has a width smaller than that of a lower portion to allow for reflection, such as a conical shape or a hemispherical shape. For example, the reflective layer 245 can have rounded edges surrounding each opening area OP.

In addition, according to the second example embodiment of the present disclosure, as the reflective layer 245 having a high taper reflective characteristic is disposed in the non-opening area NOA, light trapped or lost therein can be utilized, so that light extraction efficiency and a viewing angle can be improved. For example, in the electroluminescent display device 200 according to the second example embodiment, second light ② that is emitted at a lower emission angle from the light emitting unit 232, together with first light ① that is emitted from the light emitting unit 232 in the upper direction, is reflected from a side surface of the reflective layer 245 disposed on the bank 217, and can be extracted in the upper direction, for example, to the opening area OA.

The reflective layer 245 can be disposed in the non-opening area NOA, but an edge of the reflective layer 245 can be disposed near a boundary between the opening area OA and the non-opening area NOA, but the present disclosure is not limited thereto. For example, when the deposition blocking layer 140 is formed to extend to a portion of the non-opening area NOA, the reflective layer 245 can be disposed such that the edge thereof is positioned in the non-opening area NOA that is spaced apart from the opening area OA by a predetermined distance.

The encapsulation layer 150 can be disposed on the deposition blocking layer 140 and the reflective layer 245.

Meanwhile, as described above, the reflective layer can be disposed so that the edge thereof is positioned in the non-opening area that is spaced apart from the opening area by a predetermined distance, which will be described in detail with reference to FIGS. 7 to 9. For example, the edge of a reflective layer 345 can be set back so that it is aligned with the first inclined surface IN1 of the planarization layer 216. Alternatively, the edge of the reflective layer 345 can be aligned with the second inclined surface IN2 or the third inclined surface IN3 of the bank 217.

Figure 7:
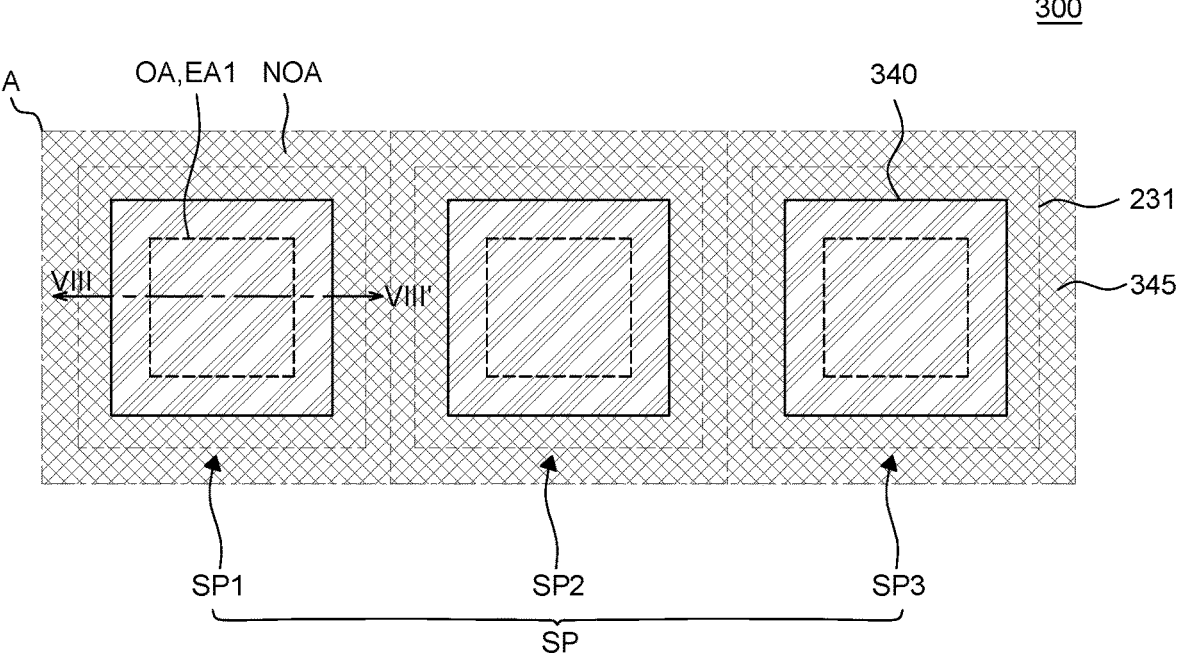
FIG. 7 is a plan view illustrating a pixel structure according to another embodiment of the present disclosure.

FIG. 7 is a plan view illustrating a pixel structure according to a third example embodiment of the present disclosure.

Figure 8:
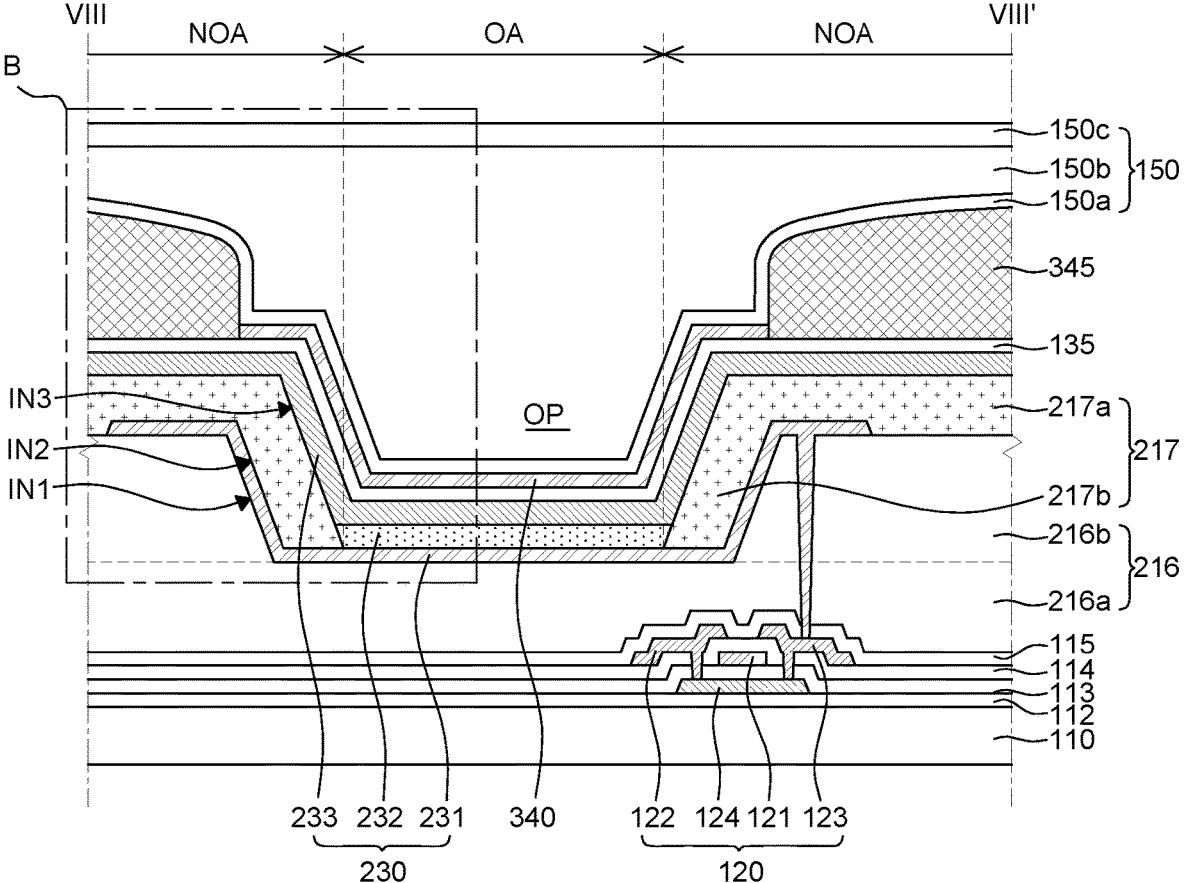
FIG. 8 is a cross-sectional view taken along line VIII-VIII' of FIG. 7 according to an embodiment of the present disclosure.

FIG. 8 is a cross-sectional view taken along line VIII-VIII' of FIG. 7.

Figure 9:
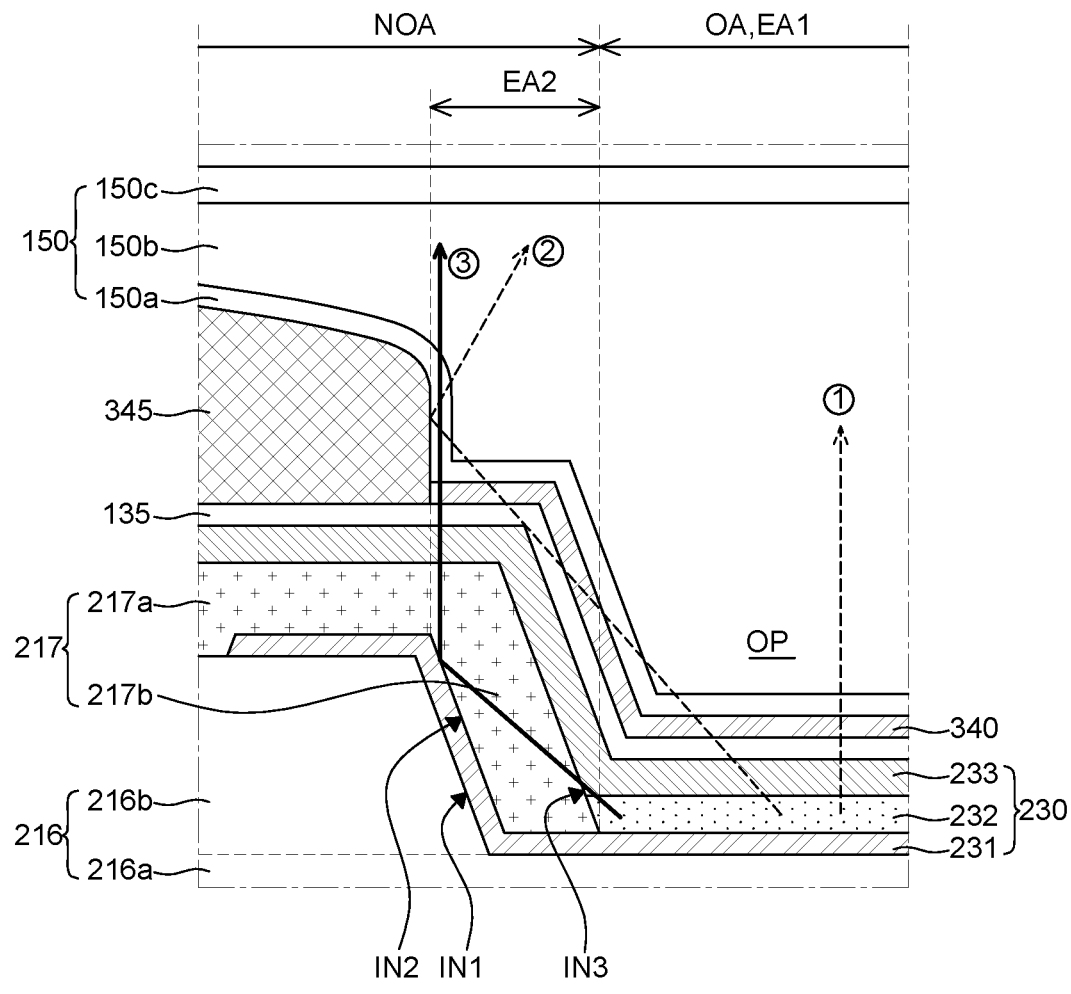
FIG. 9 is an enlarged view of part B of FIG. 8 according to an embodiment of the present disclosure.

FIG. 9 is an enlarged view of part B of FIG. 8.

The third example embodiment of FIGS. 7 to 9 differs from the second example embodiment of FIGS. 4 to 6 only in terms of configurations of a deposition blocking layer 340 and the reflective layer 345, and other configurations thereof are substantially the same, and thus, a duplicate description will be omitted or may be briefly discussed. The same reference numerals are used for the same components.

In FIG. 7, only three sub-pixels SP are illustrated for convenience of explanation. Also, FIG. 8 is a cross-sectional view of an arbitrary first sub-pixel SP1 among the three sub-pixels SP. In addition, in FIG. 7, only the anode 231 is illustrated among components of the light emitting element 230 for convenience of explanation.

Referring to FIGS. 7 to 9, an electroluminescence display 300 according to the third example embodiment of the present disclosure can be configured to include the thin film transistor 120, the light emitting element 230, the planarization layer 216, the bank 217, the deposition blocking layer 340, the reflective layer 345, and the encapsulation layer 150 that are above the substrate 110.

The electroluminescent display device 300 can be implemented as a top emission type electroluminescent display device, but is not limited thereto.

The planarization layer 216 can be disposed on the thin film transistor 120.

The planarization layer 216 can be disposed on the passivation layer 115.

The planarization layer 216 can include the base portion 216a and the protrusion portion 216b. As illustrated in FIGS. 8 and 9, the base portion 216a and the protrusion portion 216b can be integrally formed, but the present disclosure is not limited thereto.

The base portion 216a can be disposed on the thin film transistor 120.

The upper surface of the base portion 216a can have a surface parallel to the substrate 110.

The protrusion portion 216b can be disposed on the base portion 216a. The protrusion portion 216b can be integrally formed with the base portion 216a and have a shape protruding from the base portion 216a. Accordingly, the protrusion portion 216b can have an upper surface narrower than a lower surface thereof, but is not limited thereto. For example, the protrusion portion 216b can have a mesa shape.

The protrusion portion 216b can include the upper surface and the side surface. The upper surface of the protrusion portion 216b can be a surface positioned at an uppermost portion of the protrusion portion 216b and can be a surface substantially parallel to the base portion 216a or the substrate 110. The side surface of the protrusion portion 216b can be a surface connecting the upper surface of the protrusion portion 216b and the base portion 216a. Accordingly, the side surface of the protrusion portion 216b can have a shape inclined toward the base portion 216a from the upper surface. The inclined side surface of the protrusion portion 216b can be referred to as the first inclined surface IN1.

The light emitting element 230 can be disposed on the planarization layer 216.

The anode 231 can be disposed on the planarization layer 216 to cover the upper surface of the base portion 216a and at least the side surface of the protrusion portion 216b. For example, the anode 231 can be disposed on the upper surface of the base portion 216a on which the protrusion portion 216b is not disposed, the side surface of the protrusion portion 216b, and a portion of the upper surface of the protrusion portion 216b. And, the anode 231 can be disposed along shapes of the base portion 216a and the protrusion portion 216b, but the present disclosure is not limited thereto. The anode 231 can be disposed only on the upper surface of the base portion 216a on which the protrusion portion 216b is not disposed and the side surface of the protrusion portion 216b.

At this time, when the protrusion portion 216b has an inclined side surface, for example, the first inclined surface IN1, the anode 231 can have an inclined side surface corresponding to the first inclined surface IN1 of the protrusion portion 216b, for example, the second inclined surface IN2.

In the situation of the top emission type, the anode 231 can further include a reflective layer such that emitted light is reflected from the anode 231 and is more smoothly emitted in the direction toward the upper portion where the cathode 233 is disposed.

The reflective layer can be disposed on the planarization layer 216 to reflect light emitted from the light emitting element 230 upwardly. For example, the reflective layer is disposed under the light emitting unit 232 and is disposed to cover the side surface of the protrusion portion 216b of the planarization layer 216, whereby a traveling direction of third light ③ traveling toward a side portion of the light emitting unit 232 can be changed to an upper direction. Accordingly, the third example embodiment of the present disclosure, as described above, the second emission area EA2 can be additionally formed in the non-opening area NOA in addition to the first emission area EA1. In particular, unlike the above-described second example embodiment, the second emission area EA2 of the third example embodiment is characterized by including an emission area that is formed by the third light ③ due to the second inclined surface IN2 of the anode 231 and an emission area that is formed by the second light ② due to the reflective layer 345. The emission area that is formed by the second light ② will be described later in detail. For example, the second emission area EA2 according to the third example embodiment of the present disclosure can be an area extending from the opening area OA to an upper end of the second inclined surface IN2 of the anode 231, but is not limited thereto.

The bank 217 can be disposed on the anode 231 and the planarization layer 216.

The bank 217 disposed on the anode 231 and the planarization layer 216 can define sub-pixels by partitioning an area that actually emits light, for example, a first emission area EA1. However, in the situation of the third example embodiment of the present disclosure, as the second emission area EA2 is disposed in the non-opening area NOA, the non-emission area of the third example embodiment can be different from those of the first and second example embodiments, but the present disclosure is not limited thereto.

For example, the bank 217 in the first emission area EA1 is removed to thereby form an opening OP exposing a portion of the anode 231. The area in which the opening OP is formed can be defined as the opening area OA and the other area can be defined as the non-opening area NOA. In this situation, the opening area OA and the first emission area EA1 can refer to substantially the same area, but the present disclosure is not limited thereto.

In addition, the second emission area EA2 that is formed by the second inclined surface IN2 of the anode 231 and the reflective layer 345 can be disposed in the non-opening area NOA, and in this situation, the non-opening area NOA excluding the first emission area EA1 and the second emission area EA2 can be defined as the non-emission area.

The bank 217 can include the first portion 217a disposed on the protrusion portion 216b of the planarization layer 216 and the second portion 217b facing the base portion 216a from the first portion 217a. At this time, when the protrusion portion 216b has an inclined side surface, for example, the first inclined surface IN1, the second portion 217b of the bank 217 can have an inclined side surface corresponding to the first inclined surface IN1 of the protrusion portion 216b and the second inclined surface IN2 of the anode 231, for example, the third inclined surface IN3.

In this situation, the first portion 217a can be disposed to cover the protrusion portion 216b and the anode 231 on the protrusion portion 216b. The first portion 217a can planarize the upper portion of the protrusion portion 216b of the planarization layer 216. Accordingly, the first portion 217a can have a flat upper surface. For example, the upper surface of the first portion 217a can be parallel to the upper surface of the protrusion portion 216b.

In addition, the second portion 217b can be disposed toward the base portion 216a from the first portion 217a. The second portion 217b surrounds the first portion 217a and can have the third inclined surface IN3 that is inclined along a step between the upper surface of the base portion 216a and the upper surface of the protrusion portion 216b.

The light emitting unit 232 can be disposed on the anode 231.

Referring to FIGS. 8 and 9, the light emitting unit 232 is illustrated as being disposed only on the anode 231 in the first emission area EA1, but the present disclosure is not limited thereto, and the light emitting unit 232 can also be disposed on the bank 217 in the non-emission area NEA. In this situation, the light emitting unit 232 can be disposed along the shapes of the anode 231 and the bank 217. Also, the light emitting unit 232 in the opening OP can be inclined along the third inclined surface IN3 of the inclined bank 217.

At an edge of the opening OP, the cathode 233 can be inclined along the third inclined surface IN3 of the bank 217. Also, the capping layer 135 can be inclined along the third inclined surface IN3 of the bank 217 at the edge of the opening OP, but is not limited thereto. Also, the first inclined surface IN1, the second inclined surface IN2 and the third inclined surface IN3 can all be inclined at a same angle. Alternatively, the first inclined surface IN1, the second inclined surface IN2 and the third inclined surface IN3 can be inclined at different angles.

Meanwhile, it is characterized in that the deposition blocking layer 340 of the third example embodiment is disposed on the capping layer 135 in the opening area OA, and the reflective layer 345 is disposed on the capping layer 135 in the non-opening area NOA except for an area where the deposition blocking layer 340 is formed.

In FIGS. 8 and 9, the deposition blocking layer 340 is illustrated to extend from the opening area OA to the upper end of the second inclined surface IN2 of the anode 231, but the present disclosure is not limited thereto. The deposition blocking layer 340 can be disposed to extend further toward the non-opening area NOA.

As described above, the reflective layer 345 can have a side mirror structure with respect to the opening OP.

The deposition blocking layer 340 can be formed of a metal patterning layer (MPL).

In FIG. 7, an example in which an open mask having a checkerboard shape, that covers a portion of the non-opening area NOA and the opening area OA is used to form the reflective layer 245 is illustrated, but the present disclosure is not limited thereto. In this situation, the reflective layer 345 can have a checkerboard shape except for a portion of the non-opening area NOA and the opening area OA, but is not limited thereto.

The reflective layer 345 of the present disclosure can be disposed on the capping layer 135 in the non-opening area NOA.

The reflective layer 345 can be formed of a metal having a reflective characteristic, for example, silver (Ag) or aluminum (Al) having a reflective characteristic while having a surface energy of 1.0 J/m² to 1.5 J/m², for example. In particular, in the situation of silver, it is advantageous for forming a high taper due to an aggregation property thereof.

The reflective layer 145 can be formed to have a high taper, for example, can have a shape in which an upper portion has a width smaller than that of a lower portion to allow for reflection, such as a conical shape or a hemispherical shape. For example, the edges of the reflective layer 345 surrounding the opening OP can be rounded.

In the electroluminescent display device 300 according to the third example embodiment of the present disclosure, second light ② that is emitted at a lower emission angle from the light emitting unit 232, together with first light ① that is emitted from the light emitting unit 232 in the upper direction, can be reflected from a side surface of the reflective layer 345, and be extracted in the upper direction. In particular, in the third example embodiment of the present disclosure, since an edge of the reflective layer 345 is positioned in the non-opening area NOA that is spaced apart from the opening area OA by a predetermined distance, it is possible to extract the second light ② that is emitted at a lower emission angle from the light emitting unit 232, in a wider range in the upper direction, so that light extraction efficiency can be further improved. For example, the edge of the reflective layer 345 can be set back so that it is aligned with the first inclined surface IN1 of planarization layer 216. Alternatively, the edge of the reflective layer 345 can be aligned with the second inclined surface IN2 or the third inclined surface IN3 of the bank 217.

The example embodiments of the present disclosure can also be described as follows:

According to an aspect of the present disclosure, there is provided an electroluminescent display device. The electroluminescent display device includes a substrate divided into a plurality of sub-pixels having an opening area and a non-opening area, a planarization layer disposed on the substrate, an anode disposed on the planarization layer, a bank disposed on the anode and the planarization layer and having an opening exposing a portion of the anode in the opening area, a light emitting unit disposed on the exposed anode, a cathode disposed on the light emitting unit and the bank, a deposition blocking layer disposed on the cathode in a portion of the non-opening area and the opening area and a reflective layer disposed on the cathode in another portion of the non-opening area.

The electroluminescent display device can further include a capping layer disposed on the cathode, in which the deposition blocking layer and the reflective layer can be disposed on the capping layer.

The deposition blocking layer can be disposed on the capping layer in the opening area, and the reflective layer can be disposed on the capping layer in the non-opening area except for an area where the deposition blocking layer is disposed.

The reflective layer can be disposed such that a side surface thereof is positioned at a boundary between the opening area and the non-opening area or is positioned within the non-opening area near the boundary.

The reflective layer can reflect second light that is incident on the reflective layer at an emission angle lower than that of first light that is emitted from the light emitting unit in an upper direction, toward the opening area.

The planarization layer can include a base portion having an upper surface parallel to the substrate; and a protrusion portion disposed on the base portion and having a shape protruding from the base portion.

The protrusion portion can have an upper surface narrower than a lower surface thereof, in which the protrusion portion can include the upper surface parallel to the base portion and a side surface connecting the upper surface and the base portion, in which the side surface of the protrusion portion can constitute a first inclined surface that is inclined toward the base portion from the upper surface.

The anode can be disposed on the upper surface of the base portion on which the protrusion portion is not disposed, the side surface of the protrusion portion, and a portion of the upper surface of the protrusion portion, in which the anode can have a second inclined surface that is inclined to correspond to the first inclined surface.

The bank can include a first portion disposed on the protrusion portion of the planarization layer; and a second portion facing the base portion from the first portion, in which the second portion of the bank can have a third inclined surface that is inclined to correspond to the first inclined surface of the protrusion portion and the second inclined surface of the anode.

The anode can include a reflective layer, in which the second inclined surface of the anode can be disposed to cover the first inclined surface, and can reflect a traveling direction of third light traveling toward a side portion of the light emitting unit to an upper direction to thereby form a second emission area.

The bank can partition a first emission area in the opening area, and the second emission area can be positioned within the non-opening area.

The reflective layer can be disposed so that a side surface thereof is positioned in the non-opening area spaced apart from the opening area by a predetermined distance.

The deposition blocking layer can be disposed to extend from the opening area to an upper end of the second inclined surface of the anode.

The second emission area can further include an emission area that reflects second light incident on the reflective layer at an emission angle lower than that of first light that is emitted from the light emitting unit in an upper direction, toward the non-opening area.

The second emission area can be configured as an area extending from the boundary between the opening area and the non-opening area to the upper end of the second inclined surface of the anode.

The deposition blocking layer can be made of a carbon organic material such as 3-(biphenyl-4-yl)-5-(4-tert-butylphenyl)-4-phenyl-4H-1,2,4-triazole (TAZ), in which the reflective layer can be made of silver (Ag) or aluminum (Al).

The deposition blocking layer can have a greater width and a wider area than those of the opening area.

The reflective layer can be in contact with a side surface of the deposition blocking layer.

The reflective layer can be disposed in a slit shape in one direction except for the opening area, in the plurality of sub-pixels.

The reflective layer can be disposed in all of the sub-pixels except for the opening area, in the plurality of sub-pixels.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto.

Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device, comprising:
a substrate divided into a plurality of sub-pixels having an opening area and a non-opening area;
a planarization layer disposed on the substrate;
an anode disposed on the planarization layer;
a bank disposed on the anode and the planarization layer, the bank having an opening exposing a portion of the anode in the opening area;
a light emitting unit disposed on the portion of the anode;
a cathode disposed on the light emitting unit and the bank;
a deposition blocking layer disposed on the cathode in a portion of the non-opening area and the opening area; and
a reflective layer disposed on the cathode in another portion of the non-opening area,
wherein the reflective layer does not overlap with the deposition blocking layer, and
wherein the reflective layer is in direct contact with a side surface of the deposition blocking layer.

2. The electroluminescent display device of claim 1, wherein the deposition blocking layer is made of a carbon organic material, wherein the reflective layer is made of silver (Ag) or aluminum (Al).

3. The electroluminescent display device of claim 2, wherein the carbon organic material is 3-(biphenyl-4-yl)-5-(4-tert-butylphenyl)-4-phenyl-4H-1,2,4-triazole (TAZ).

4. The electroluminescent display device of claim 1, further comprising:

a capping layer disposed on the cathode, wherein the deposition blocking layer and the reflective layer are disposed on the capping layer.

5. The electroluminescent display device of claim 4, wherein the deposition blocking layer is disposed on the capping layer in the opening area, and wherein the reflective layer is disposed on the capping layer in the non-opening area except for an area where the deposition blocking layer is disposed.

6. The electroluminescent display device of claim 1, wherein a side surface of the reflective layer is positioned at a location corresponding to a boundary between the opening area and the non-opening area or the side surface of the reflective layer is positioned within the non-opening area at a location spaced apart from the boundary.

7. The electroluminescent display device of claim 6, wherein the reflective layer is configured to reflect second light incident on the reflective layer at an emission angle lower than first light emitted from the light emitting unit in an upward direction, toward the opening area.

8. The electroluminescent display device of claim 6, wherein the planarization layer includes:

a base portion having an upper surface parallel to the substrate; and a protrusion portion disposed on the base portion and having a shape protruding from the base portion.

9. The electroluminescent display device of claim 8, wherein the protrusion portion includes an upper surface parallel to the base portion and a first inclined surface connecting the upper surface and the base portion.

10. The electroluminescent display device of claim 9, wherein the anode is disposed on the upper surface of the base portion, the side surface of the protrusion portion, and a portion of the upper surface of the protrusion portion, and wherein the anode has a second inclined surface inclined at an angle corresponding to the first inclined surface of the protrusion portion.

11. The electroluminescent display device of claim 10, wherein the bank includes:

a first bank portion disposed on the protrusion portion of the planarization layer; and a second bank portion extending from the first bank portion in a direction toward the base portion of the planarization layer, wherein the second bank portion of the bank has a third inclined surface inclined at an angle corresponding to the first inclined surface of the protrusion portion and the second inclined surface of the anode.

12. The electroluminescent display device of claim 10, wherein the anode includes a reflective layer, wherein the second inclined surface of the anode overlaps with the first inclined surface of the protrusion portion, and the second inclined surface is configured to reflect a traveling direction of third light traveling in a side direction from the light emitting unit toward an upper direction and form a second emission area with the third light.

13. The electroluminescent display device of claim 12, wherein the bank partitions a first emission area in the opening area, and wherein the second emission area is positioned within the non-opening area.

14. The electroluminescent display device of claim 13, wherein a side surface of the reflective layer is disposed in the non-opening area and spaced apart from the opening area by a predetermined distance.

15. The electroluminescent display device of claim 14, wherein the deposition blocking layer extends from the opening area to a location higher than an upper end of the second inclined surface of the anode.

16. The electroluminescent display device of claim 15, wherein the second emission area further includes an emission area configured to reflect second light incident on the reflective layer at an emission angle lower than an emission angle of the first light emitted from the light emitting unit in the upward direction, toward the non-opening area.

17. The electroluminescent display device of claim 16, wherein the second emission area extends from the boundary between the opening area and the non-opening area to the upper end of the second inclined surface of the anode.

18. The electroluminescent display device of claim 1, wherein a width of the deposition blocking layer is greater than a width of the opening area, and wherein an area of the deposition blocking layer is greater than an area of the opening area.

19. The electroluminescent display device of claim 1, wherein the reflective layer is disposed in a slit shape in one direction except for the opening area, in the plurality of sub-pixels.

20. The electroluminescent display device of claim 1, wherein the reflective layer is disposed in all of the sub-pixels except for the opening area, in the plurality of sub-pixels.

21. The electroluminescent display device of claim 1, further comprising:

an encapsulation layer disposed on the deposition blocking layer and the reflective layer, wherein the deposition blocking layer is disposed between the cathode and the encapsulation layer.

22. A display device, comprising:

a subpixel disposed on a substrate, the subpixel including a first electrode layer, a light emitting layer and a second electrode layer;

a bank including an opening for the subpixel;

a deposition blocking layer disposed on the second electrode in the opening of the bank; and a reflective layer disposed on the cathode in an area overlapping with the bank, wherein the reflective layer does not overlap with the deposition blocking layer in a vertical direction with respect to the substrate, and wherein the reflective layer is in direct contact with a side surface of the deposition blocking layer.

23. The display device of claim 22, wherein the reflective layer includes a hole corresponding to the opening in the bank, and wherein inner edges of the reflective layer corresponding to the hole are in direct contact with outer edges of the deposition blocking layer, or the deposition blocking layer is seated inside the hole in the reflective layer, or an inner edge of the reflective layer corresponding to the hole overlaps with an inclined surface of the bank.

24. The display device of claim 22, wherein the deposition blocking layer is made of a carbon organic material.

25. The display device of claim 22, wherein a lower surface of the reflective layer is flush with a lower surface of the deposition blocking layer.

26. The display device of claim 22, wherein the reflective layer includes a hole corresponding to the opening in the bank, and wherein inner edges of the reflective layer corresponding to the hole have a rounded shape.

27. The display device of claim 22, wherein the reflective layer is thicker than the deposition blocking layer, and wherein an uppermost surface of the reflective layer is disposed higher than an uppermost surface of the deposition blocking layer.

\* \* \* \* \*